(12) United States Patent
Fan

(10) Patent No.: US 6,693,494 B2
(45) Date of Patent: Feb. 17, 2004

(54) FREQUENCY SYNTHESIZER WITH THREE MODE LOOP FILTER CHARGING

(75) Inventor: Yiping Fan, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 95 days.

(21) Appl. No.: 09/935,861

(22) Filed: Aug. 20, 2001

(65) Prior Publication Data

US 2003/0034846 A1 Feb. 20, 2003

(51) Int. Cl.$^7$ ................................................ H03L 7/00
(52) U.S. Cl. ........................ 331/17; 327/156; 327/157
(58) Field of Search ........................... 331/17; 327/156, 327/157

(56) References Cited

U.S. PATENT DOCUMENTS

| | | | | |
|---|---|---|---|---|
| 4,167,711 A | * | 9/1979 | Smoot | 331/17 |
| 4,745,372 A | * | 5/1988 | Miwa | 331/8 |
| 5,121,085 A | * | 6/1992 | Brown | 331/8 |
| 6,028,905 A | | 2/2000 | Gaines | |
| 6,111,470 A | * | 8/2000 | Dufour | 331/17 |
| 6,215,362 B1 | * | 4/2001 | Feng et al. | 331/17 |
| 6,466,070 B1 | * | 10/2002 | Ross | 327/157 |
| 6,476,681 B1 | * | 11/2002 | Kirkpatrick | 331/17 |
| 2002/0005763 A1 | * | 1/2002 | Aoki | 331/11 |
| 2002/0140470 A1 | * | 10/2002 | Aoki et al. | 327/157 |

FOREIGN PATENT DOCUMENTS

EP          1005167 A      5/2000

* cited by examiner

*Primary Examiner*—Michael Tokar
*Assistant Examiner*—Khan Nguyen

(57) ABSTRACT

A phase-locked loop fractional-N frequency synthesizer, particularly of a sigma delta type, has a voltage controlled oscillator, a fractional-N frequency divider, a phase comparator, a charge pump, and a loop filter. The loop filter has a capacitive element for receiving a charge pump current from the charge pump. A filtered charge pump current controls the voltage controlled oscillator. The charge pump is operable in three current modes, a pre-charging/pre-discharging mode, a speed up mode, and a normal, locked mode. In the pre-charging/pre-discharging mode the charge pump is decoupled from the phase comparator so that the phase locked loop is open, and in the speed up and normal modes the charge pump is coupled to the phase comparator so that the phase locked-loop is closed.

12 Claims, 3 Drawing Sheets

FREQUENCY SYNTHESIZER WITH THREE MODE LOOP FILTER CHARGING

BACKGROUND OF THE INVENTION

1. Field of the Invention

The present invention relates to a fractional-N synthesizer, more particularly to a fractional-N synthesizer comprising a loop filer and a charge pump that provides a current to the loop filter.

The present invention further relates to an apparatus comprising a fractional-N synthesizer. Such an apparatus can be a radio frequency communication device, or any other device that needs a fractional-N synthesizer.

2. Description of the Related Art

In Philips™ datasheet SA8028, "2.5 GHz sigma delta fractional-N synthesizer and 750 MHz auxiliary synthesizer", a sigma delta fractional-N synthesizer is disclosed. The SA8028 device integrates programmable dividers, charge pumps and phase comparators to implement phase-locked loops. The synthesizer operates at VCO input frequencies up to 2.5 GHz and has fully programmable main auxiliary, and reference dividers. The main divider is a fractional-N divider with programmable integer ratios from 33 to 509 and uses a second order sigma-delta modulator to achieve a fractional division resolution of 22 programmable bits. The charge pump current is set by an external resistor. Two main charge pumps are driven by a main phase detector, and an auxiliary charge pump is driven by an auxiliary phase detector. Lock detection is available only for the auxiliary phase detector. The SA8028 fractional-N synthesizer operates in two modes operation, a speed up mode for faster switching when the VCO frequency needs to change from one frequency to another, and a normal mode for a better phase noise after locking of the phase-locked loop. In the SA8028 synthesizer, in the speed up mode a loop filter bandwidth is wider than in the normal mode. This is achieved by applying a higher charge pump current to the loop filter at the speed up mode than in the normal mode, a wider bandwidth achieving a faster switching or acquisition time and faster locking, and a narrower bandwidth better suppressing in-band phase noise. In addition to using a higher charge pump current for bandwidth widening, also other parameters of the loop filter may be changed such as reducing resistive elements that determine a main time constant of the loop filter.

SUMMARY OF THE INVENTION

It is an object of the invention to provide a fractional-N synthesizer with a substantially increased switching time.

It is another object of the invention to provide such a fractional-N synthesizer of the sigma delta type.

It is still another object of the invention to provide such a fractional-N synthesizer that automatically switches from a speed up mode of operation to a normal mode of operation.

It is still another object of the invention to provide such a fractional-N synthesizer with lock detection, without the need of an auxiliary phase detector.

In accordance with the invention, a fractional-N frequency synthesizer is provided, said fractional-N synthesizer comprising:

voltage controlled oscillator means for providing a frequency output signal;

fractional-N frequency division means for dividing said frequency output signal;

phase comparator means for comparing a reference clock signal with said fractional-N divided frequency output signal;

loop filtering means for filtering a current, said loop filtering means providing a filtered current to said voltage controlled oscillator means, and comprising a capacitive element for receiving said current;

charge pump means for providing said current, said charge pump means being controllable by said phase comparator means, and successively being operable in a first operating mode in which said current has a first value, a second operating mode in which said current has a second value, and a third operating mode in which said current has a third value, said first value being substantially higher than said second and third values, in said first operating mode said charge pump at least substantially being decoupled from said phase comparator means, and in said second and third operating modes said charge pump being coupled to said phase comparator means.

The invention is based on the insight of first operating the synthesizer in open loop mode to maximally explore the charge pump where loop stability is not a determining factor, upon powering up or upon a frequency change, and then operating the synthesizer in closed loop mode for locking and tracking where loop stability is a determining factor. This is because in closed loop mode loop filter bandwidth cannot be increased indefinitely for stability reasons. The invention is further based upon the insight that particularly in sigma delta type fractional-N synthesizers, or the like, where N, the ratio of a desired VCO output frequency and a reference frequency, is substantially smaller than in conventional synthesizers and herewith a capacitor that determines a main time constant in the loop filter is substantially larger. The invention provides pre-charging of such a much larger capacitor, in an open loop mode of operation where loop stability is not a determining factor. The invention is thus based upon the insight that pre-charging is needed, and the further insight that pre-charging time may become a dominant factor in the switching time that is otherwise determined by PLL acquisition time. Because pre-charging is done with an open loop the charge pump can have maximum duty cycle thereby providing a huge charge pump current that very quickly pre-charges the dominant capacitor in the loop filter.

In an embodiment, the three operating modes are implemented using three different current sources as the charge pump means.

In another embodiment, the three operating modes are implemented using two current sources, one current source being operated at pre-charging while being disconnected from the phase comparator, and being operated at speed up while being connected to the phase comparator, i.e., first operating in an open loop and then operating in a closed loop, and another current source being operated in closed loop normal mode.

Preferably, mode switching from speed up mode to normal mode is done automatically, upon locking of the PLL, by using an averaged phase error over a given time window that can be much smaller than the acquisition time. In an embodiment such mode switching is achieved by a low pass filter that is coupled between the phase detector and a switch that switches controlled by the low pass filter, the switch switching off the speed up current upon the PLL entering its locked condition. In an embodiment, a one bit quantizer with a dead zone is used to detect the averaged phase error. If a voltage across a capacitor in the low pass filter is within the dead zone, at a sampling time, a phase lock condition exists and the switch is controlled the synthesizer from speed up to normal mode. In an embodiment, the low pass filter has a switch bridging the capacitor, the switch being closed at given intervals to discharge the capacitor. This is to prevent slow discharge after a locking condition has been detected. In an embodiment, the switch is closed at a given multiple of cycles of the reference clock.

Alternatively, phase error averaging can be achieved by a digital low pass filter where the phase error is sampled and averaged.

BRIEF DESCRIPTION OF THE DRAWING

Throughout the figures the same reference numerals are used for the same features.

DESCRIPTION OF THE DETAILED EMBODIMENTS

Figure 1:
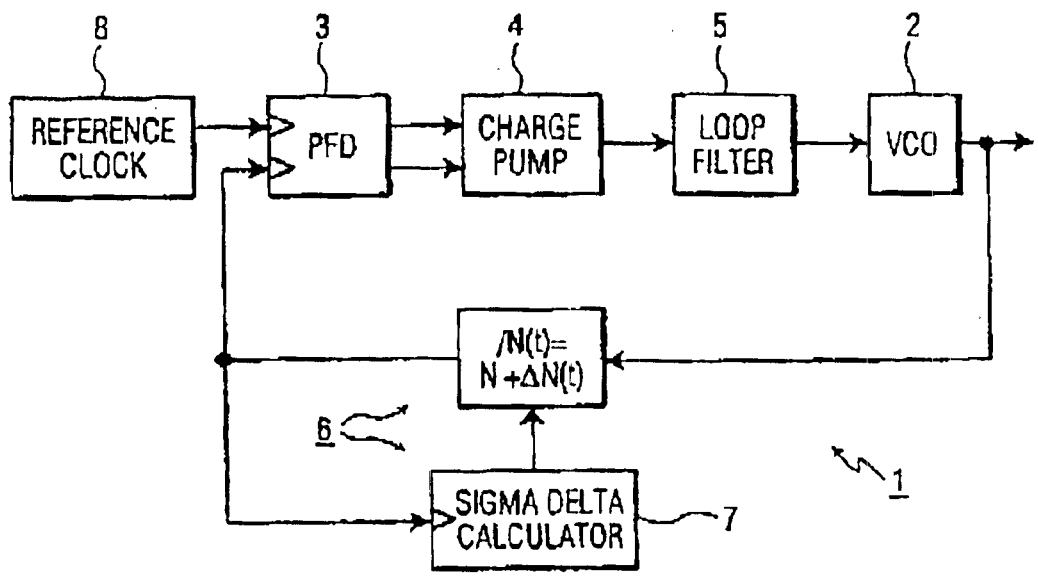
FIG. 1 is a block diagram of a prior art sigma delta fractional-N synthesizer.

FIG. 1 is a block diagram of a prior art sigma delta fractional-N synthesizer 1. Prior art synthesizer 1 comprises a voltage controlled oscillator 2 that is comprised in a phase-locked loop further comprising a phase/frequency detector 3, a charge pump 4, a loop filter 5, and instantaneous fractional-N division means/N(t) comprised of a constant divider part N and a periodic time varying part ΔN(t) given the VCO frequency. ΔN(t) is output by sigma delta calculator 7. Phase/frequency detector 3 compares a divided voltage controlled oscillator signal to a reference frequency signal provided by reference clock 8. In case of said SA8028 synthesizer, the synthesizer operates in two modes of operation, upon powering up or at a frequency change, in a speed up mode, and, upon locking of the phase locked loop, in a normal, tracking operating mode. Such a PLL synthesizer is a closed loop system.

Figure 2:
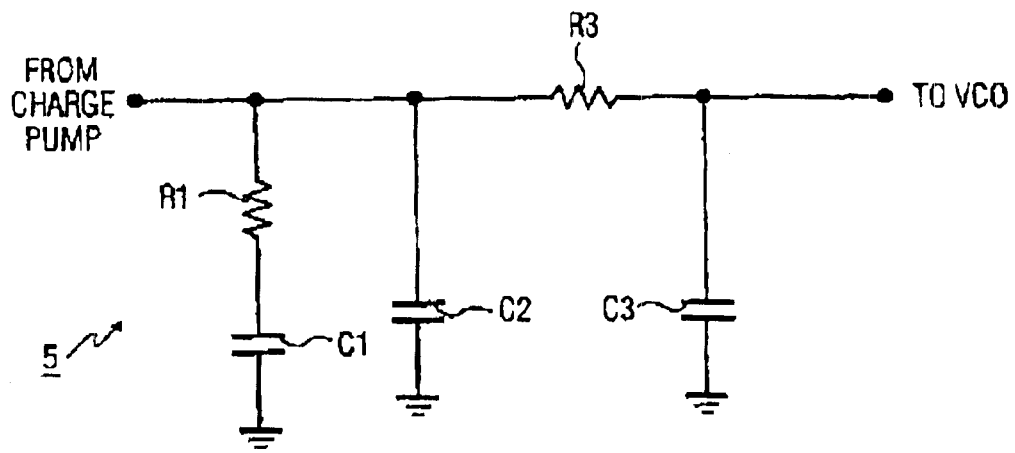
FIG. 2 is a prior art loop filter.

FIG. 2 is a circuit diagram of prior art three pole loop filter 5 comprising capacitors C1, C2, and C3, and resistors R1 and R3. In addition to filtering, loop filter 5 converts a charge pump current to a voltage output signal that controls VCO 2. Typically, resistor R1 and capacitor C1 dominate PLL loop dynamics. In another often applied loop filter resistor R3 and capacitor C3 are absent.

Figure 3:
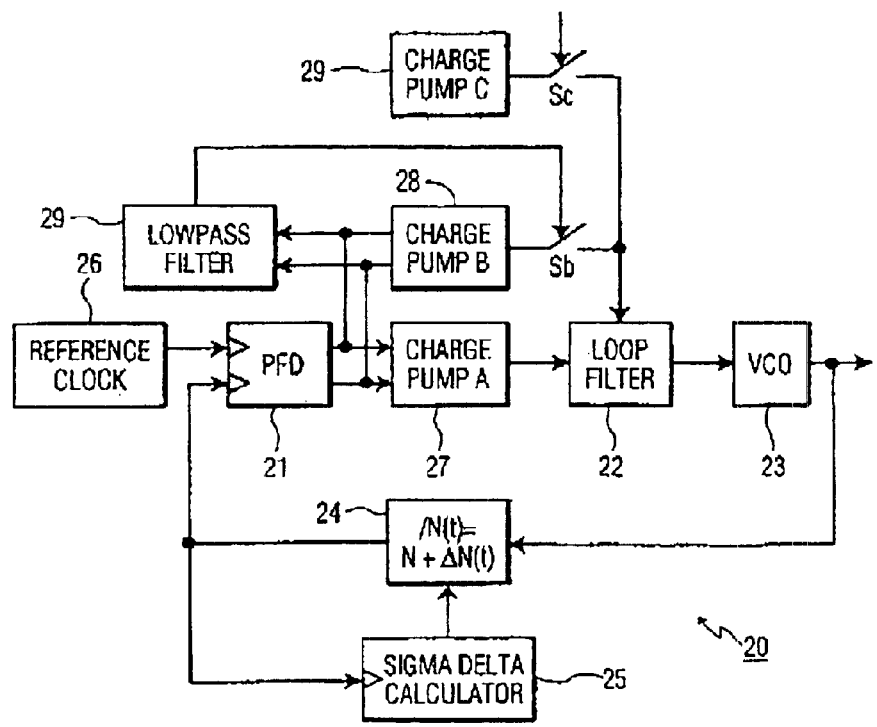
FIG. 3 a block diagram of a sigma delta fractional-N synthesizer according to the invention.

FIG. 3 a block diagram of a sigma delta fractional-N synthesizer 20 according to the invention. Synthesizer 20 comprises a phase/frequency detector 21, a loop filter 22, a voltage controlled oscillator 23, a fractional-N divider 24, a sigma delta calculator 25, and a reference clock 26. For operating in three operating modes, a pre-charge mode, a speed up mode, and a normal mode, synthesizer 20 further respectively comprises charge pumps 27, 28, and 29. Charge pumps 27 and 28 control loop filter 22 in closed loop PLL mode, and, charge pump 27 dominantly controls loop filter 22 in open loop mode by not being coupled to phase/frequency detector 21 and by providing a substantially larger current than charge pumps 27 and 28. Because of this open loop mode where loop stability is no longer a determining factor, charge pump 29 may be operated up to maximum duty cycle thereby quickly charging or discharging dominant loop filter capacitor C1, depending on the sign of the frequency/phase deviation. Loop filter bandwidth depends on the magnitude of the charge pump current, a larger current resulting in a wider bandwidth. With a smaller N, the ratio of the desired VCO output frequency and the reference frequency, as in sigma delta fractional-N synthesizers, to maintain the same bandwidth as in conventional synthesizers, dominant loop filter capacitor C1 needs to be increased accordingly. In addition to the usual acquisition time, there now is an additional, pre-charging time of dominant capacitor C1 that contributes to the switching time. In sigma delta fractional-N synthesizers, such pre-charging time may even become dominant, i.e., may become larger than the acquisition time. Therefore, as it was recognized by the present applicant/inventor, there is a need to quickly pre-charge or pre-discharge dominant capacitor C1 upon powering up or upon a frequency change. Alternatively to the shown embodiment, synthesizer 20 may only comprises two charge pumps, one charge pump being operated as open loop and closed loop pump, in the respective pre-charge/pre-discharge and speed up modes, and another charge pump being operated as closed loop pump, the normal mode. Although at first sight, one might think that a two mode of operation, with speed up and normal closed loop modes, could be made optimal, the applicant/inventor had recognized that such an approach would be based on assumptions not being valid under practical circumstances by only under non-existing ideal circumstances. This is because under practical circumstances, in a charge pump configuration of a positive and a negative current source, also an intermediate state of both current sources being switched off. This means that in practice the charge pump duty cycle would be reduced in closed loop mode, and that, also for this reason, no maximum duty cycle could be achieved. In this respect, while testing a two mode synthesizer, the applicant/inventor observed that, long before a final frequency was reached, the VCO frequency did not go up continuously but rather followed an up and down going pattern.

Frequency synthesizer 20 further comprises a low pass filter 129 that controls a switch Sb connecting or disconnecting charge pump 28 to loop filter 22, and externally operated switch Sc. Alternatively, switch Sb can also be controlled by a digital low pass filter. When the VCO frequency error is roughly within a given frequency limit, synthesizer 20 is switched from pre-charge/pre-discharge mode to speed up mode. In this respect, the initial frequency error is much larger than the frequency error specified for the acquisition time so that it can be chosen easily by simple experimentation. In a predetermined time window, low pass filter 129 averages a phase error output by phase/frequency detector 21. The maximum phase error is up to one VCO cycle. However, the averaged phase error over a given time window is negligible and does not need to be averaged over a complete sigma delta sequence. Therefore, the time window for averaging the phase error may be chosen much smaller than the acquisition time. The averaged phase error is substantially smaller than the original phase error. Based upon this recognition, the applicant/inventor recognized that the averaged phase error could be used as a PLL locking indicator, and further to automatically switch synthesizer 20 from speed up mode to normal mode.

Figure 4:
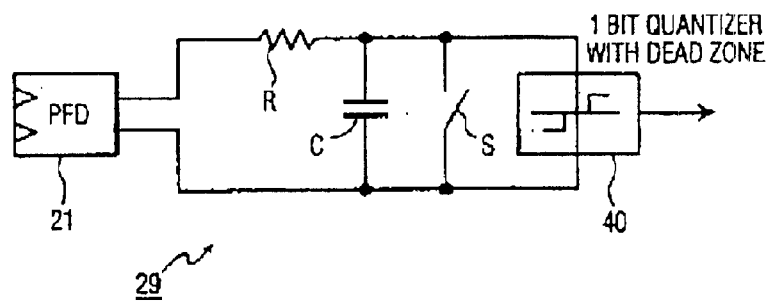
FIG. 4 is a low pass filter and a 1-bit quantizer for lock detection and automatic switching in a fractional-N synthesizer according to the invention.

FIG. 4 shows an embodiment of low pass filter 129 further including a 1-bit quantizer 40, for lock detection and automatic switching in a fractional-N synthesizer according to the invention. Low pass filter 129 comprises a resistor R, and a capacitor C that is bridged by a switch S. First order low pass RO-filter 129 performs phase error averaging. Before locking of the PLL, the average phase error is either a large positive or negative number thereby saturating low pass filter 129. Upon locking, the average phase error becomes very small in a given time window. 1-bit quantizer 40 with high input impedance, has a dead zone. If the voltage across capacitor C is within the dead zone, a phase lock condition exists and is detected. 1-bit quantizer 40 then also controls switch Sb to control synthesizer 20 from speed up mode to normal mode. Sampling of the output of 1-bit quantizer 40 is done shortly before discharging capacitor C. Such discharging by short-circuiting is needed because it would otherwise take a very long time before capacitor C would have been discharged. Switch S may be controlled periodically to short capacitor C, by closing switch S at a predetermined number of clock cycles of reference clock 26.

Figure 5:
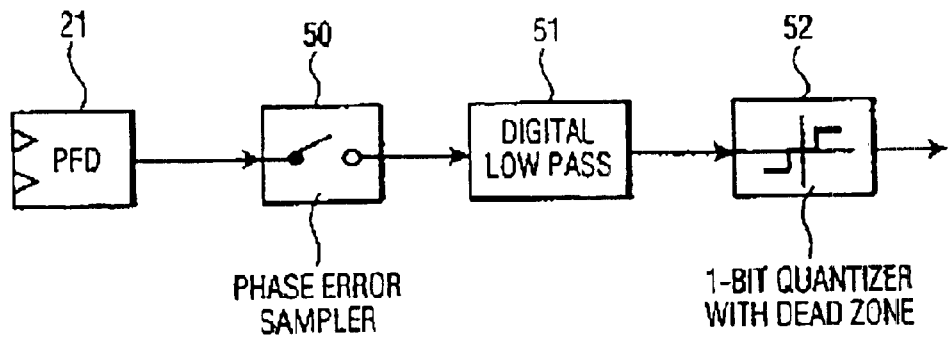
FIG. 5 shows a digital low pass filter in a fractional-N synthesizer according to the invention.

FIG. 5 shows a digital low pass filter implementation in a fractional-N synthesizer according to the invention, for controlling switch Sb. A phase error sampler 50 samples a phase error output of phase/frequency detector 21. A digital low pass filter or averaging filter 51 filters the sampled phase error. The sampled and filtered signal is provided to a digital input of a 1-bit quantizer 52 that has a dead zone.

Figure 6:
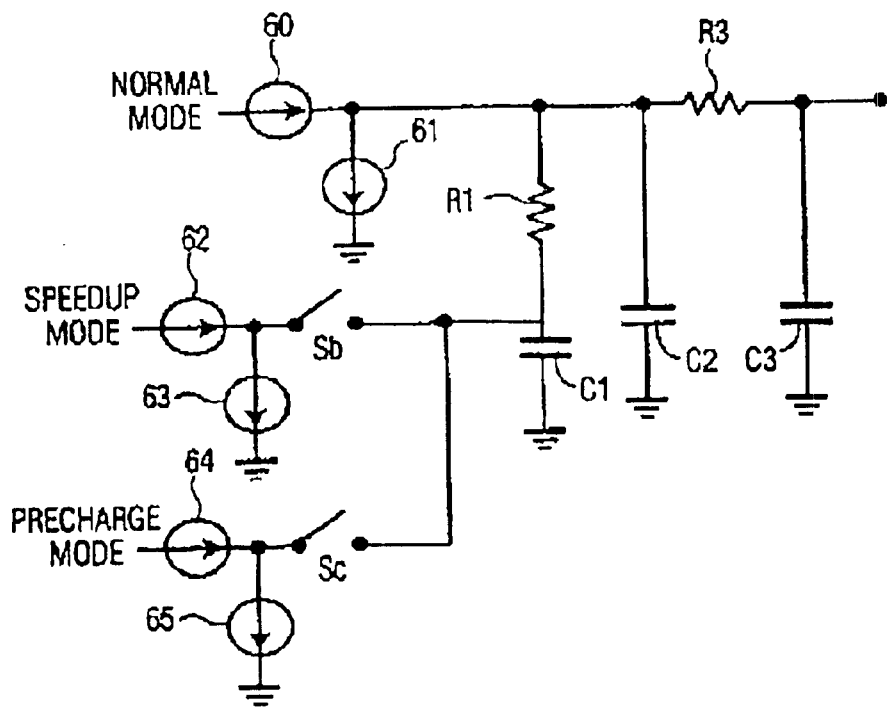
FIG. 6 is a circuit diagram for three mode fractional-N synthesizer operation according to the invention.

FIG. 6 is a circuit diagram for three mode fractional-N synthesizer operation according to the invention. Current sources 60 and 61 provide a charge pump current in normal mode, current sources 62 and 63 dominantly provide a charge pump in speed up mode, and current sources 64 and 65 dominantly provide a charge pump current in pre-charge/pre-discharge mode.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A fractional-N frequency synthesizer, comprising:
    voltage controlled oscillator means for providing a frequency output signal;
    fractional-N frequency division means for dividing said frequency output signal;
    phase comparator means for comparing a reference clock signal with said fractional-N divided frequency output signal;
    loop filtering means for filtering a current, said loop filtering means providing a filtered current to said voltage controlled oscillator means, and comprising a capacitive element for receiving said current; and
    charge pump means for providing said current, said charge pump means being controllable by said phase comparator means, and successively being operable in a first operating mode in which said current has a first value, a second operating mode in which said current has a second value, and a third operating mode in which said current has a third value, said first value being substantially higher than said second and third values,
    in said first operating mode said charge pump means at least substantially being decoupled from said phase comparator means, and in said second and third operating modes said charge pump means being coupled to said phase comparator means;
    wherein said charge pump means comprises first current source means for providing said current of said first and second values, and second current source means for providing said current of said third value, said first operating mode and said second mode forming a speed-up operating mode of said fractional-N frequency synthesizer in which said frequency output signal is being locked to a predetermined frequency, and said third operating mode being a normal operating mode of said fractional-N frequency synthesizer in which said frequency output signal is within a given locking range.

2. The fractional-N frequency synthesizer as claimed in claim 1, said fractional-N frequency division means comprising a sigma-delta modulator and a divider controlled by said sigma-delta modulator.

3. The fractional-N frequency synthesizer of claim 1, further comprising an automatic switching circuit coupled to the charge pump; wherein the automatic switching comprises a digital low pass filter.

4. A fractional-N frequency synthesizer, comprising:
    voltage controlled oscillator means for providing a frequency output signal;
    fractional-N frequency division means for dividing said frequency output signal;
    phase comparator means for comparing a reference clock signal with said fractional-N divided frequency output signal;
    loop filtering means for filtering a current, said loop filtering means providing a filtered current to said voltage controlled oscillator means, and comprising a capacitive element for receiving said current; and
    charge pump means for providing said current, said charge pump means being controllable by said phase comparator means, and successively being operable in a first operating mode in which said current has a first value, a second operating mode in which said current has a second value, and a third operating mode in which said current has a third value, said first value being substantially higher than said second and third values,
    in said first operating mode said charge pump means at least substantially being decoupled from said phase comparator means, and in said second and third operating modes said charge pump means being coupled to said phase comparator means;
    automatic switching means for automatically switching said fractional-N frequency synthesizer from said second operating mode to said third operating mode;
    wherein said automatic switching means are configured to average a phase output signal of said phase comparator means, said averaged phase output signal being used for automatically switching said fractional-N frequency synthesizer from said second operating mode to said third operating mode.

5. A fractional-N frequency synthesizer as claimed in claim 4, wherein said automatic switching means comprises a low pass filter and a one-bit quantizer with a dead zone, said one-bit quantizer being coupled to said low pass filter and providing a switch-over signal for switching said fractional-N frequency synthesizer from said second operating mode to said third operating mode if said averaged output signal falls within said dead zone.

6. A fractional-N frequency synthesizer as claimed in claim 5, wherein said low pass filter comprises a capacitor and a switch across said capacitor, said fractional-N frequency synthesizer being configured to close said switch in order to discharge said capacitor.

7. A fractional-N frequency synthesizer as claimed in claim 6, being configured to close said switch at a given multiple of cycles of said reference clock signal.

8. An apparatus, comprising a fractional-N frequency synthesizer, said fractional-N synthesizer comprising:
- a voltage controlled oscillator operable to provide a frequency output signal;
- a fractional-N frequency divider operable to divide said frequency output signal;
- a phase comparator operable to compare a reference clock signal with said fractional-N divided frequency output signal;
- a loop filter operable to filter a current, said loop filter providing a filtered current to said voltage controlled oscillator, and comprising a capacitive element coupled to receive said current; and
- a charge pump operable to provide said current, said charge pump being controllable by said phase comparator, and successively being operable in a first operating mode in which said current has a first value, a second operating mode in which said current has a second value, and a third operating mode in which said current has a third value, said first value being substantially higher than said second and third values,
- in said first operating mode said charge pump at least substantially being decoupled from said phase comparator, and in said second and third operating modes said charge pump being coupled to said phase comparator;
- wherein said charge pump comprises a first current source operable to provide said current of said first and second values, and a second current source operable to provide said current of said third value, said first operating mode and said second mode forming a speed-up operating mode of said fractional-N frequency synthesizer in which said frequency output signal is being locked to a predetermined frequency, and said third operating mode being a normal operating mode of said fractional-N frequency synthesizer in which said frequency output signal is within a given locking range.

9. The apparatus as claimed in claim 8, wherein said fractional-N frequency synthesizer comprises an automatic switching circuit operable to average a phase output signal of said phase comparator, said averaged phase output signal being used for automatically switching said fractional-N frequency synthesizer from said second operating mode to said third operating mode.

10. The apparatus as claimed in claim 9, wherein said automatic switching circuit comprises a low pass filter and a one-bit quantizer with a dead zone, said one-bit quantizer being coupled to said low pass filter and providing a switch-over signal for switching said fractional-N frequency synthesizer from said second operating mode to said third operating mode if said averaged output signal falls within said dead zone.

11. The apparatus of claim 10, wherein the low pass filter comprises a digital low pass filter.

12. The apparatus as claimed in claim 8, wherein said fractional-N frequency divider comprises a sigma-delta modulator and a divider controlled by said sigma-delta modulator.

* * * * *